United States Patent
Liu et al.

(10) Patent No.: US 9,219,099 B1
(45) Date of Patent: Dec. 22, 2015

(54) MEMORY STRUCTURE AND PREPARATION METHOD THEREOF

(71) Applicant: NATIONAL CHIAO TUNG UNIVERSITY, Hsinchu (TW)

(72) Inventors: Po-Tsun Liu, Hsinchu (TW); Yang-Shun Fan, Hsinchu County (TW); Chun-Ching Chen, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/561,194

(22) Filed: Dec. 4, 2014

(30) Foreign Application Priority Data

Sep. 4, 2014 (TW) .............................. 103130596 A

(51) Int. Cl.
*H01L 29/02* (2006.01)
*H01L 27/24* (2006.01)
*H01L 45/00* (2006.01)

(52) U.S. Cl.
CPC .......... *H01L 27/2436* (2013.01); *H01L 45/147* (2013.01); *H01L 45/1625* (2013.01)

(58) Field of Classification Search
CPC ....... H01L 45/04; H01L 45/06; H01L 45/065; H01L 45/141
USPC ........................................................ 257/2, 4
See application file for complete search history.

(56) References Cited

U.S. PATENT DOCUMENTS

| 6,841,833 B2 | 1/2005 | Hsu et al. |
| 2004/0100814 A1 | 5/2004 | Hsu |
| 2014/0027702 A1 | 1/2014 | Lu et al. |

OTHER PUBLICATIONS

Ming-Chi Wu et al., "Low-Power and Highly Reliable Multilevel Operation in ZrO2 1T1R RRAM" IEEE Electron Device Letters, vol. 32, No. 8, Aug. 2011, pp. 1026-1028.
Myoung-Jae Lee et al., "Low-Temperature-Grown Transistion Metal Oxide Base Storage Materials and Oxide Transistors for High-Density Non-volatile Memory." Adv. Funct. Mater, 2009, 19, 1587-1593.
D. Walczyk et al., "Resistive switching characteristics of CMOS embedded HfO2-based 1T1R cells." Microelectronic Engineering 88 (2011) 1133-1135.

*Primary Examiner* — Tan N Tran
(74) *Attorney, Agent, or Firm* — CKC & Partners Co., Ltd.

(57) ABSTRACT

A memory structure includes a control unit and a memory unit electrically connected to the control unit. The control unit includes a source and a drain; an active layer in contact with a portion of the source and a portion of the drain; a gate layer; and a gate insulation layer disposed between the active layer and the gate layer. The memory unit includes a bottom electrode layer; a top electrode layer; and a resistive switching layer interposed between the bottom electrode layer and the top electrode layer, which the resistive switching layer and the active layer are formed of aluminum zinc tin oxide (AZTO).

6 Claims, 5 Drawing Sheets

MEMORY STRUCTURE AND PREPARATION METHOD THEREOF

RELATED APPLICATIONS

This application claims priority to Taiwanese Application Serial Number 103130596, filed Sep. 4, 2014, which is herein incorporated by reference.

BACKGROUND

1. Field of Invention

The present invention relates to memory structure and preparation method thereof. More particularly, the present invention relates to a resistive random access memory controlled by a transistor, and preparation method thereof.

2. Description of Related Art

Memory devices are distinguished into volatile memory devices and non-volatile memory devices, in which the volatile memory devices can be further categorized into DRAM (dynamic random access memory) and SRAM (static random access memory). These memory devices are widely used due to their high access speed. Besides, one of the most popular non-volatile memory devices is flash memory. However, the flash memory has shortcomings of high operating voltage, slow rewriting speed, and low durability. Further, due to the smaller size of the devices, the gate oxide layer of the flash memory devices becomes thinner and causes larger leakage current, which decrease reliability of the flash memory devices.

In recent years, the development of the resistive random access memory has considered as the key technology for low-power consumption and high-density non-volatile memory in the next generation. The resistive random access memory includes advantages of simple structure, low operating voltage, fast rewriting speed, high applicability to multi-bit applications, good endurance of read/write small size, non-destructive read operation and low cost. The common structure used by the resistive random access memory is metal-insulator-metal (MIM), and an external bias voltage is applied to modify the resistance to perform the read and the write operations such that the memory can switch between a high resistance state and a low resistance state corresponding to the states of "0" and "1" of the digital signal. The resistive switching layer formed by the metal oxide is the most important and the most studied part of the resistive random access memory. However, the reaction time of the measure instrument is too slow for controlling the resistive random access memory, and thus resulting in current overshoot or device crashing during switching resistance.

Thus, the design of the resistive random access memory with a control unit has to be studied in order to make the device have a good endurance under the circumstances of frequent switches between different resistance states.

SUMMARY

The invention provides a resistive random access memory having a control unit and preparation method thereof, to avoid current overshoot occurred in the resistive random access memory, and thus increasing the operating stability of the resistive random access memory.

An aspect of the present invention provides a memory structure including a control unit and a memory unit electrically connected to the control unit. The control unit includes a source and a drain; an active layer in contact with a portion of the source and a portion of the drain; a gate layer; and a gate insulation layer disposed between the active layer and the gate layer. The memory unit includes a bottom electrode layer; a top electrode layer; and a resistive switching layer interposed between the bottom electrode layer and the top electrode layer, which the resistive switching layer and the active layer are formed of aluminum zinc tin oxide (AZTO).

According to various embodiments of the present disclosure, the gate layer is formed of silicon, and the gate insulation layer is formed of silicon dioxide.

According to various embodiments of the present disclosure, the source and the drain are formed of titanium.

According to various embodiments of the present disclosure, the top electrode layer is formed of titanium, titanium nitride, indium tin oxide (ITO) or combinations thereof, and the bottom electrode layer is formed of gold, platinum or combinations thereof.

According to various embodiments of the present disclosure, the memory structure further including a hafnium oxide interposed between the resistive switching layer and the bottom electrode layer.

According to various embodiments of the present disclosure, the memory unit is in contact with the source or the drain.

An aspect of the present invention provides a method of fabricating a memory structure. A control unit is formed including following operations. A gate layer is provided, which is annealed in wet oxygen to form a gate insulation layer on the gate layer. An active layer is sputtered on the gate insulation layer, and a source and a drain are respectively deposited on opposite sides of the active layer. A memory unit is formed on the control unit, including following operations. A bottom electrode layer is deposited on the drain, and a resistive switching layer is sputtered on the bottom electrode layer, which the resistive switching layer and the active layer are formed of aluminum zinc tin oxide (AZTO). Final, a top electrode layer is deposited on the resistive switching layer.

According to various embodiments of the present disclosure, a temperature of forming the control unit is in a range from about 400° C. to about 500° C.

According to various embodiments of the present disclosure, a temperature of forming the memory unit is in a range from about 15° C. to about 35° C.

According to various embodiments of the present disclosure, the method further includes forming a hafnium oxide layer between the resistive switching layer and the bottom electrode layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
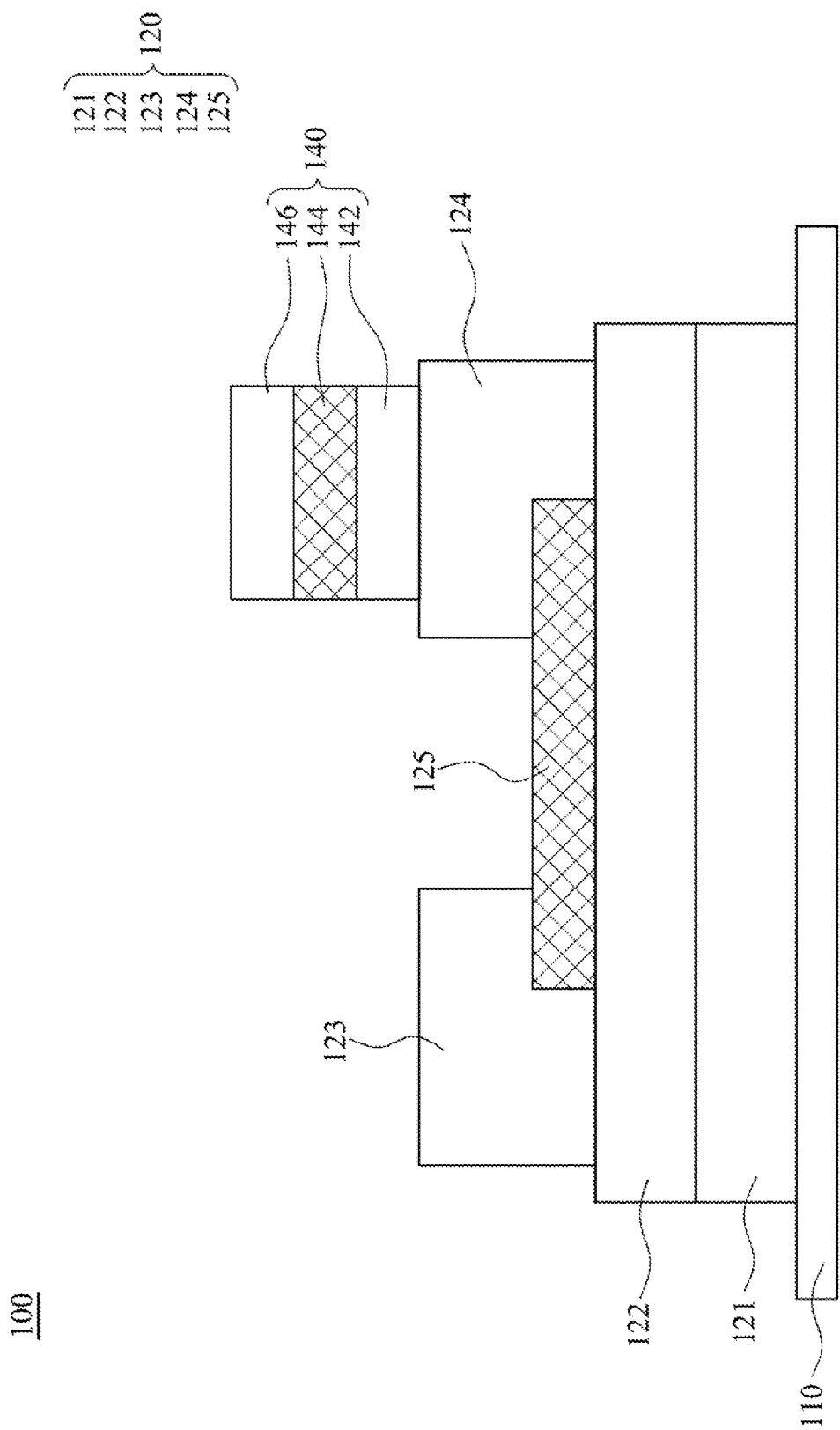
FIG. 1 is a cross-sectional view of a memory structure, in accordance with some embodiments.

Reference will now be made in detail to the present embodiments of the invention, examples of which are illustrated in the accompanying drawings. Wherever possible, the same reference numbers are used in the drawings and the description to refer to the same or like parts.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

A resistive random access memory (RRAM) is operated by switching between a high resistance state and a low resistance state, to define the storage value is "1" or "0". Generally, a measure instrument is applied to comply the current for achieving switch between the high resistance state and the low resistance state. But the measure instrument will cause overshoot current during switching and generate leakage current, resulting in unstable resistance value. To solve the problem of leakage current, each memory unit is connected to a control unit in series. Since a transistor has more stable operating characteristics than that of the measure instrument, using one transistor-one resistor (1T1R) array structure will effectively reduce the incidence of current overshooting.

Please refer to FIG. 1, FIG. 1 illustrates a cross-sectional view of a memory structure, in accordance with various embodiments. A memory structure 100 includes a substrate 110, a control unit 120 and a memory unit 140, which the substrate 110 may be a silicon substrate, a glass substrate, a metal substrate or a polymer membrane substrate.

The control unit 120 is an inverted staggered bottom gate thin film transistor, which includes a gate layer 121, and a material of the gate layer 121 is silicon with low resistance. A gate insulation layer 122 is disposed on the gate layer 121, and a material of the gate insulation layer 122 is silicon dioxide. A source 123 and a drain 124 are disposed on the gate insulation layer 122, and a material of the source 123 and the drain 124 is titanium. An active layer 125 is disposed on the gate insulation layer 122 and in contact with a portion of the source 123 and a portion of the drain 124, which a material of the active layer 125 is aluminum zinc tin oxide (AZTO).

AZTO is a transparent amorphous oxide semiconductor (TAOS) material, which is suitable for forming active layer 125. AZTO is used to replace inorganic amorphous silicon or polysilicon. Generally, amorphous silicon has problems of low carrier mobility, high operating voltage, and instability of electrical, property, and polysilicon has problems of high costs, process complexity, and device poor uniformity. Using AZTO solves the problems mentioned above, and a electron mobility of AZTO could achieve 5 $cm^2/V \cdot s$, corresponding to a electron mobility of polysilicon is only 0.1 $cm^2/V \cdot s$.

In embodiments, the material of the gate layer 121 is a metal, for example, aluminum (Al), molybdenum (Mo), titanium (Ti), tungsten (W) or related alloys. In various embodiments, pentacene or poly(3-hexylthiophene) (P3HT) is deposited on the active layer 125 to make the control unit 120 transport electrons or electron holes.

Continuing in FIG. 1, the memory structure 100 further includes the memory unit 140, which is disposed on and electrically connects to the drain 124 of the control unit 120. The memory unit 140 is a resistive random access memory (RRAM), which includes a lamellar structure of metal-insulator-metal (MIM). With applying a bias on the memory unit 140, the resistance of the memory unit 140 is changed to perform write and erase operations. In various embodiments, the memory unit 140 is disposed on the source 123 of the control unit 120.

The memory unit 140 includes a bottom electrode layer 142, and a material of the bottom electrode layer 142 is gold or platinum. A resistive switching layer 144 is disposed on the bottom electrode layer 142, and a material of the resistive switching layer 144 is AZTO, which is same as the active layer 125. A top electrode layer 146 is disposed on the resistive switching layer 144, and a material of the top electrode layer 146 is titanium, titanium nitride or indium tin oxide (ITO). The resistance of the memory unit 140 is switched by forming or cutting conductive paths in the resistive switching layer 144, which the conductive paths are generally formed by biasing the resistive switching layer 144 to generate defects therein. The defects may include metal ions or oxygen vacancies.

In embodiments, the resistive switching layer 144 is a bi-layer resistive switching layer including an AZTO layer and a hafnium oxide ($HfO_2$) layer. The bi-layer resistive switching layer could decrease operating current of the memory unit 140 and increase uniformity of resistance switching.

It is worth noting that the material of the active layer 125 and the resistive switching layer 144 is AZTO. Since AZTO has advantages of novel transparent characteristics, high carrier mobility, superior low-temperature deposition conditions, and uniform amorphous area, which could be applied to manufacture the active layer 125 and the resistive switching layer 144. Besides, there are no indium and gallium in AZTO. Since indium and gallium are expensive, using AZTO will reduce the costs of manufacturing memory structure 100 and maintain excellent storage characteristics. But the material of the active layer 125 of the control unit 120 and the resistive switching layer 144 of the memory unit 140 is not limited thereto, other transparent amorphous oxide semiconductor materials without indium and gallium could also be applied.

The memory structure 100 discussed above has advantages over existing structures. Because AZTO is transparent and amorphous, which could be deposited on a flexible substrate in low temperature circumstance for manufacturing the active layer 125 and resistive switching layer 144 of the memory structure 100. Further, the memory structure 100 and a switch component process of the display panel are integrated for low-power flexible electronics field, and easily achieve the above purposes.

In embodiments, the resistive switching layer 144 may be disposed directly on the source 123 or the drain 124, and the source 123 or the drain 124 acts as the bottom electrode 142 of the memory unit 140.

It should be understood that the material of the element already described would not be repeated herein. The material of the element in following embodiments will not be repeated again, please refer to foregoing embodiments.

Figure 2:
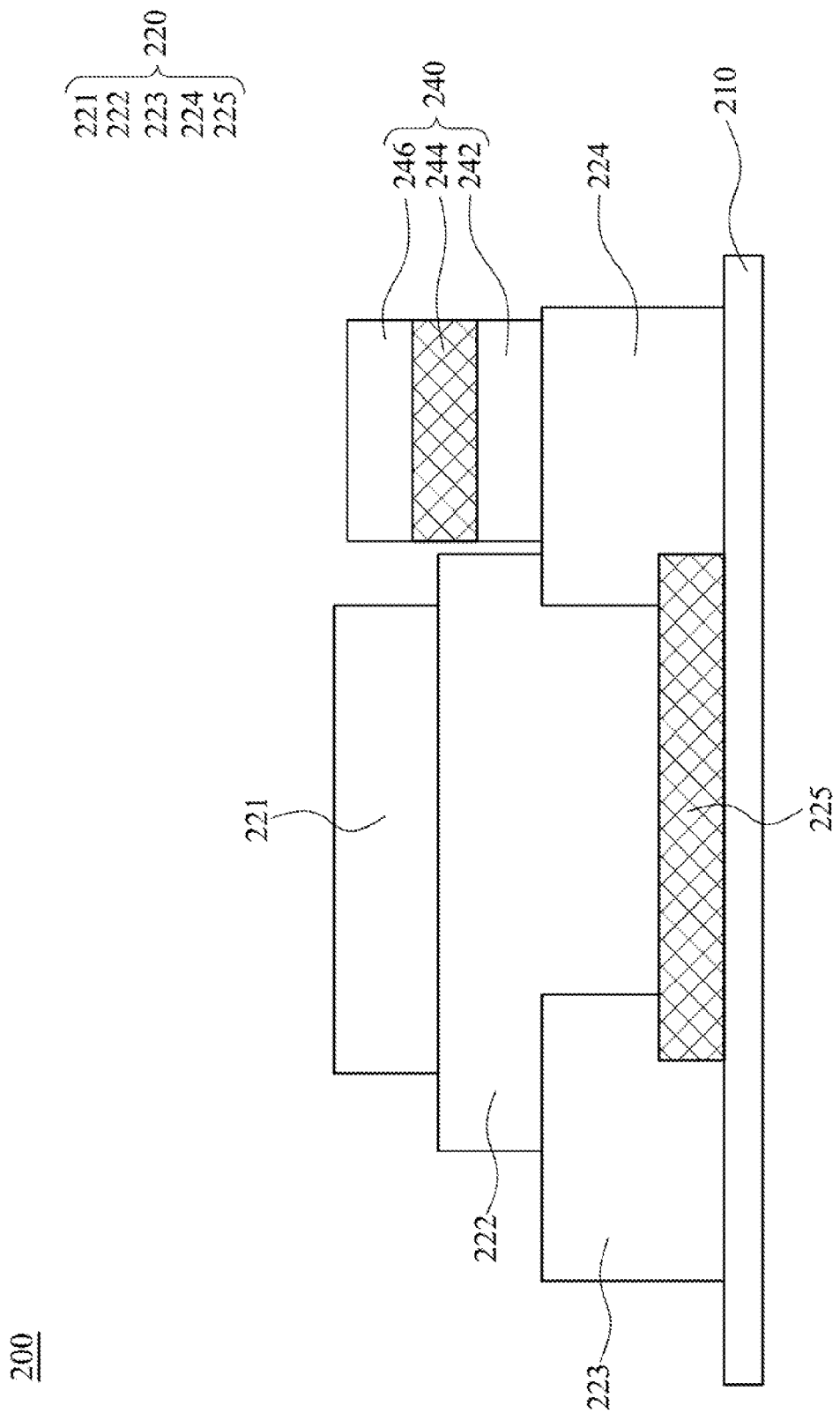
FIG. 2 is a cross-sectional view of a memory structure, in accordance with various embodiments.

Please refer to FIG. 2, FIG. 2 illustrates a cross-sectional view of a memory structure, in accordance with various embodiments. A memory structure 200 includes a substrate 210, a control unit 220 and a memory unit 240, which the substrate 210 may be a silicon substrate, a glass substrate, a metal substrate or a polymer membrane substrate.

The control unit 220 is an inverted staggered top gate thin film transistor, which includes a source 223 and a drain 224 disposed on the substrate 210; an active layer 225 disposed on the substrate 210 and in contact with a portion of the source 223 and a portion of the drain 224; a gate insulation layer 222 disposed on the source 223, the drain 224 and the active layer 225; and a gate layer 221 disposed on the gate insulation layer 222.

Continuing in FIG. 2, the memory structure 200 further includes the memory unit 240, which is disposed on and electrically connected to the drain 224 of the control unit 220. The memory unit 240 includes a bottom electrode 242, a resistive switching layer 244 disposed on the bottom electrode 242, and a top electrode 246 disposed on the resistive switching layer 244, which the resistive switching layer 244 and the active layer 225 are formed of AZTO.

Figure 3:
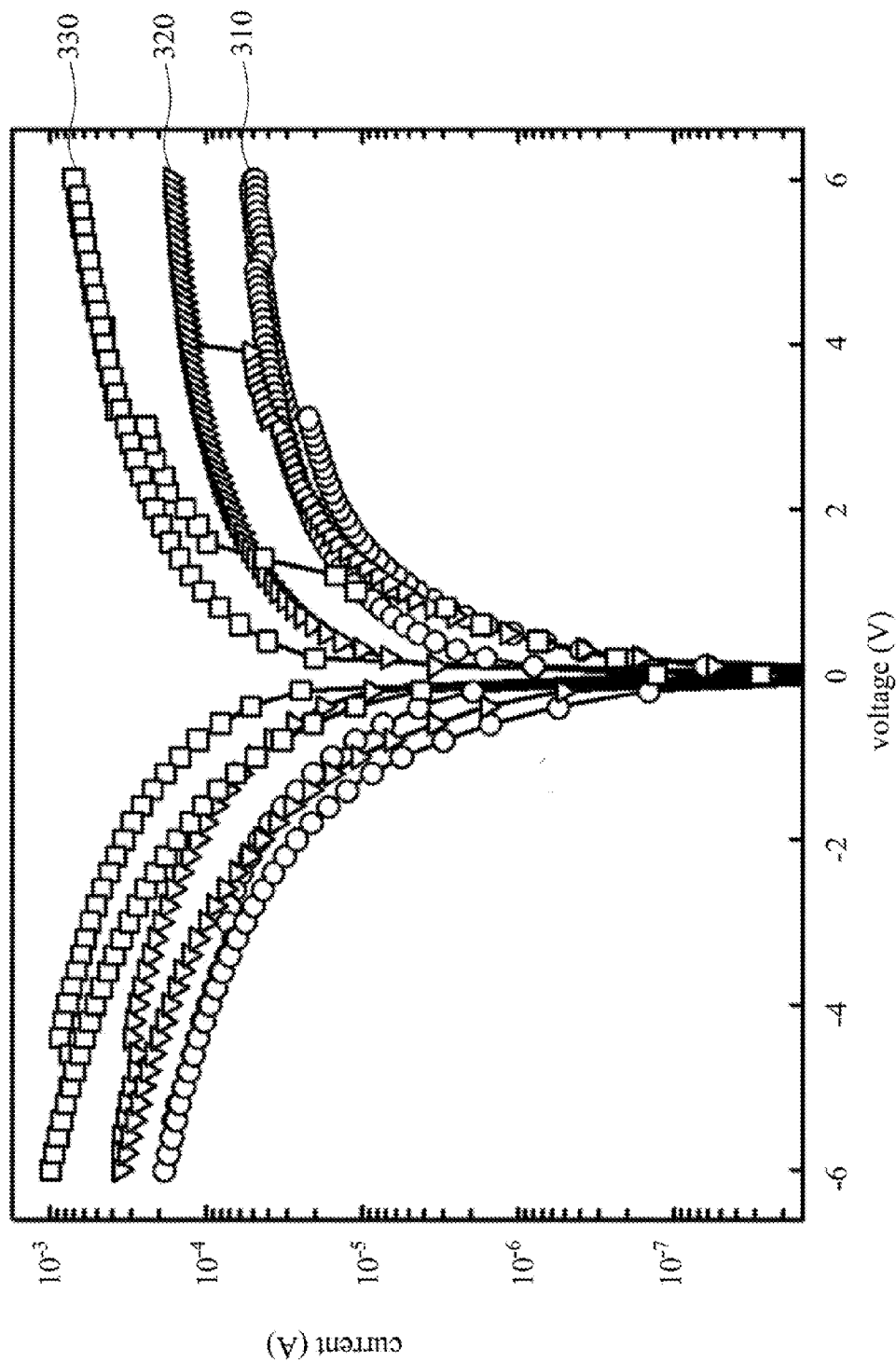
FIG. 3 is a diagram depicting the relation between the voltage and the current when applying different bias voltages on the gate layer, in accordance with various embodiments.

Please refer to FIG. 3, FIG. 3 is a diagram depicting the relation between the voltage and the current when applying different bias voltages on the gate layer. Please refer to FIG. 1 at the same time. As shown in FIG. 3, Experiment 310 illustrates a curve according to the set and reset procedure of the resistive switching layer 144 when the bias voltage is 10 V, which the curve is formed by the round-shaped points. Experiment 320 illustrates a curve according to the set and reset procedure of the resistive switching layer 144 when the bias voltage is 20 V, which the curve is formed by the triangle-shaped points. Experiment 330 illustrates a curve according to the set and reset procedure of the resistive switching layer 144 when the bias voltage is 30 V, which the curve is formed by the square-shaped points.

In Experiment 310-330, different voltages are applied on the gate layer 121 to make the control unit 120 output a current to the drain 124. Because the drain 124 is electrically connected to the bottom electrode 142 of the memory unit 140, the current is a set current (Iset) of the resistive switching layer 144. In set procedure, a positive bias voltage is applied to the bottom electrode 142 and the top electrode 146, and the current flowing through the resistive switching layer 144 increases rapidly at a set voltage (Vset), to switch the resistive switching layer 144 to the low resistance state.

In reset procedure, a negative bias voltage is applied to the bottom electrode 142 and the top electrode 146, and the current flowing through the resistive switching layer 144 decreases rapidly at a reset voltage (Vreset), to switch the resistive switching layer 144 back to the high resistance state. In this case, the current output from the control unit 120 to the drain 124 is a reset current (Ireset) of the resistive switching layer 144. A cycle includes one set procedure and one reset procedure. Hence, the resistive switching layer 144 is switched between low resistance state and low resistance state to define the storage value is "1" or "0". Since the storage value is defined according to the resistance of the resistive switching layer 144, the memory unit is also called resistive random access memory.

In Experiment 310, 320 and 330, the bias voltage on the gate layer 121 (gate voltage) is 10 V, 20 V and 30 V, respectively. Higher gate voltage make the control unit 120 output a higher current to the drain 124. Therefore, the set and reset currents of the resistive switching layer 144 are increased corresponding to the increase of the gate voltage. Because the set and reset currents are varied with the gate voltage, the resistive switching layer 144 in Experiment 310, 320 and 330 have different resistance values at their low resistance state.

Figure 4:
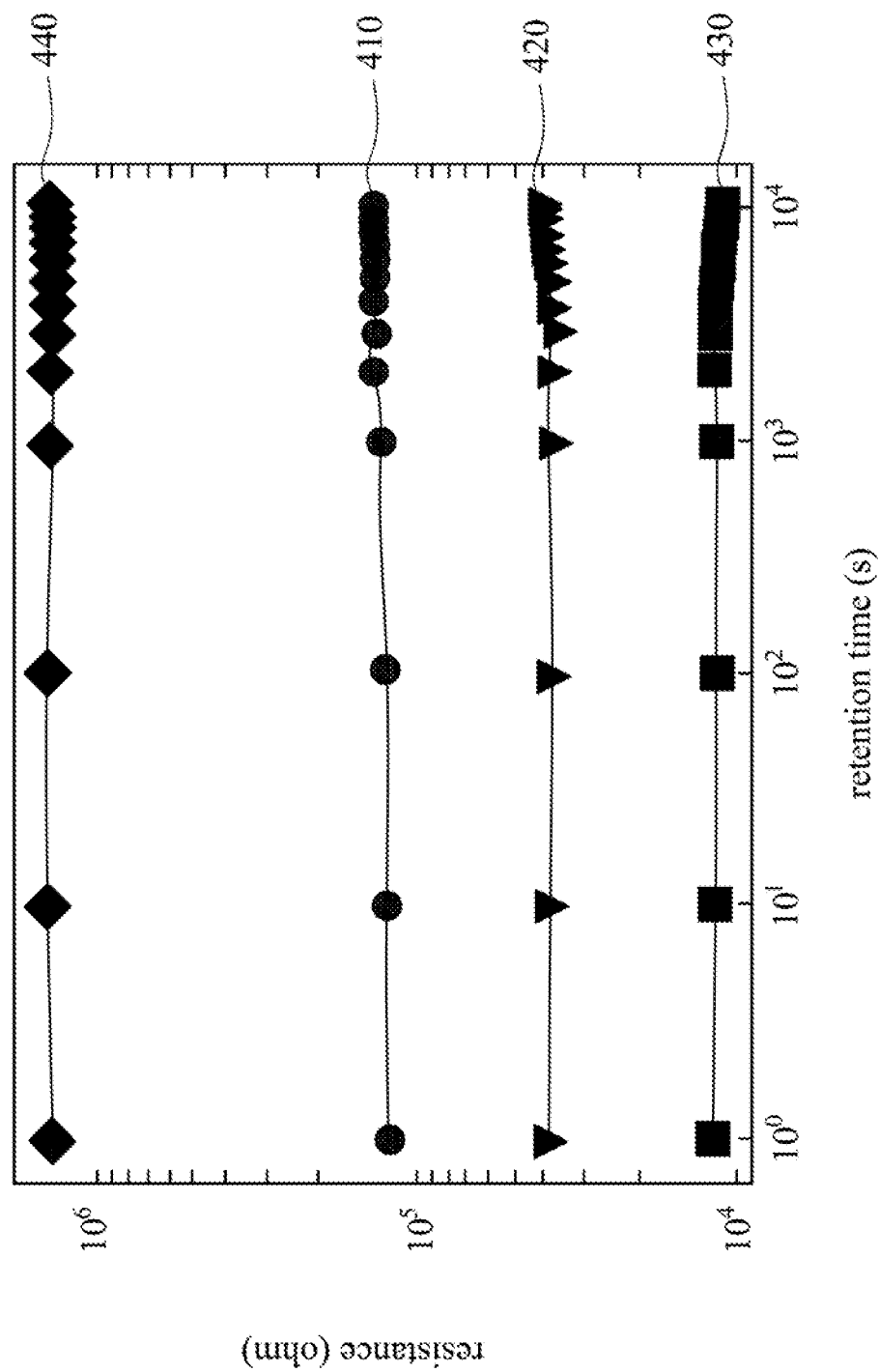
FIG. 4 is a diagram depicting the relation between the data retention time and the resistances of different resistance states, in accordance with various embodiments.

Please refer to FIG. 4 at the same time to further clarify the present disclosure. FIG. 4 is a diagram depicting the relation between the data retention time and the resistances of different resistance states. As shown in FIG. 4, the resistive switching layer 144 in Experiment 310 is switched from a high resistance state 440 to a first low resistance state 410 during set procedure; the resistive switching layer 144 in Experiment 320 is switched from the high resistance state 440 to a second low resistance state 420 during set procedure; and the resistive switching layer 144 in Experiment 330 is switched from the high resistance state 440 to a first low resistance state 430 during set procedure. The resistance of the high resistance state 440 is higher than the resistance of the first low resistance state 410; the resistance of the first low resistance state 410 is higher than the resistance of the second low resistance state 420; and the resistance of the second low resistance state 420 is higher than the resistance of the third low resistance state 430. It worth noting that regulating the gate voltage of the control unit 120 enables the memory unit 140 to form a plurality of different resistance states, which could storage values having four states (two bits per memory cell). More specifically, the resistive switching layer 144 is switched between multiple low resistance states 410, 420 and 430 and the high resistance state 440 to define the storage value is "00", "10," "01" or "11".

In embodiments, more different gate voltages are applied to make the memory unit 140 storage values having more than four states.

As shown in FIG. 4, using AZTO as the material of the resistive switching layer 144 enables the resistive switching layer 144 having obvious memory states. Besides, the resistance between resistance states has a significant difference, which shows excellent memory characteristics because of the storage values are easy to be defined. Besides, an external read voltage of 200 mV is applied continuously to the resistive switching layer 144 after switching from the high resistance state 440 to these low resistance state 410, 420 and 430, respectively. The memory structure 100 is in a circumstance of room temperature (27° C.) for measuring relation between the data retention time and the resistances of these resistance states. It is obvious that these resistances have little changes in at least $10^4$ seconds, and thus the data retention characteristic can be maintained.

The AZTO can be used as the replacement of indium and gallium since they are in great demand for use in the manufacturing process of the memory devices. Further, AZTO has great characteristics of the memory and can be fabricated in low temperature circumstance. Meanwhile, the AZTO increases carrier mobility of the active layer 125. Using the same material for preparing the resistance switching layer 144 and the active layer 125 is more effective in reducing costs, and also simplifies the manufacturing process.

Figure 5:
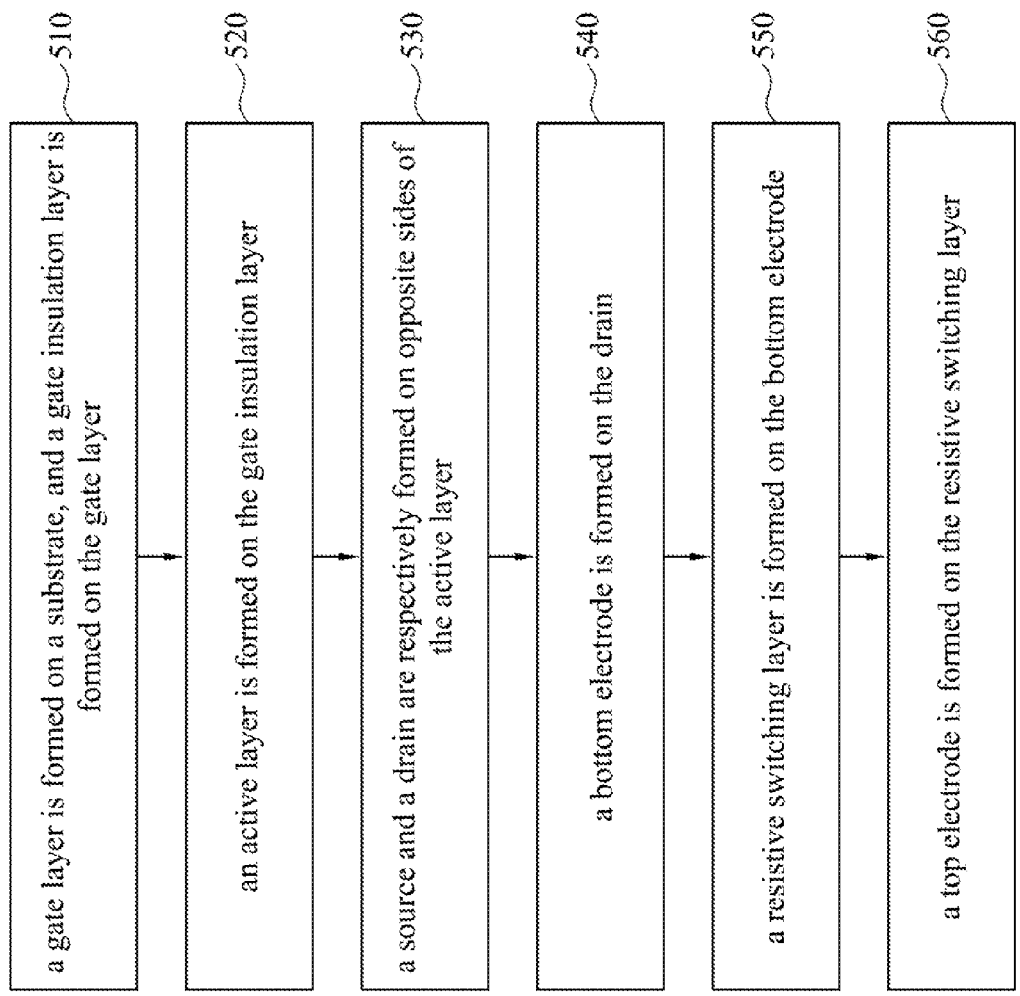
FIG. 5 is a flow chart of a method for manufacturing the memory structure, in accordance with various embodiments.

Please refer to FIG. 5, FIG. 5 is a flow chart of a method for manufacturing the memory structure, in accordance with various embodiments. Please refer to FIG. 1 at the same time, the control unit 120 in following description is an inverted staggered bottom gate thin film transistor. Referring to operation 510, a gate layer is formed on a substrate, and a gate insulation layer is formed on the gate layer. A silicon wafer having low resistance is deposited on the substrate 110 to act as the gate layer 121, which is annealed in wet oxygen to form silicon dioxide as the gate insulation layer 122. In embodiments, the gate layer 121 may be formed of metal, for example, aluminum, molybdenum, titanium, tungsten or related alloys, and the silicon dioxide is further deposited on the gate layer 121.

Continuing in operation 520, an active layer is formed on the gate insulation layer. The AZTO is sputtered on the gate insulation layer 122 to form the active layer 125. The AZTO in active layer 125 is a transparent amorphous oxide semiconductor material without indium and gallium, so that the costs of manufacturing the memory structure are reduced significantly. Besides, using AZTO decreases the process temperature, since the control unit 120 could be formed at a temperature in a range from about 400° C. to 450° C. In various embodiments, the pentacene or poly(3-hexylthiophene) (P3HT) is further deposited on the active layer 125 to make the control unit 120 transport electrons or electron holes.

Referring to operation 530, a source and a drain are respectively formed on opposite sides of the active layer. The source 123 and the drain 124 are formed by electron beam evaporating titanium on both sides of the active layer 125, which is in contact with a portion of the source 123 and a portion of the drain 124. When applying bias to the gate layer 121, the active layer 125 acts as a channel so that current could flow from the source 123 to the drain 124.

Continuing in operation 540, a bottom electrode is formed on the drain. The bottom electrode 142 is formed by electron beam evaporating gold or platinum on the drain 124. In embodiments, the bottom electrode 142 is formed by electron beam evaporating gold or platinum on the source 123.

Referring to operation 550, a resistive switching layer is formed on the bottom electrode. The AZTO is sputtered on the bottom electrode 142 to act as the resistive switching layer. As aforementioned, the AZTO includes good memory characteristics, and data retention time could maintain for at least $10^4$ seconds. Therefore, the AZTO increases variety of applications of the resistive switching layer 144 in the industry. Further, using AZTO decreases the process temperature, since the memory unit 140 could be formed at a temperature in a range from about 15° C. to about 35° C. Besides, there is no gallium or indium in the AZTO, and thus efficiently decreasing costs of the process. Please refer to operation 520 and 550 at the same time, the resistive switching layer 144 and the active layer are formed of the AZTO. Using the same material for manufacturing the control unit 120 and the memory unit 140 decreases the costs and also simplifies the process.

In various embodiments, the hafnium oxide is sputtered on the bottom electrode 142, and the AZTO is sputtered on the hafnium oxide to form a bi-layer resistive switching layer. The bi-layer resistive switching layer decreases working current and increases the uniformity of resistance switching.

Continuing in operation 560, a top electrode is formed on the resistive switching layer. The top electrode 146 is formed by electron beam evaporating titanium, titanium nitride or indium tin oxide (ITO) on the resistive switching layer 144. The bottom electrode 142, the resistive switching layer 144 and the top electrode 146 form a resistive random access memory (RRAM), which includes a lamellar structure of metal-insulator-metal (MIM). The resistance of the resistive random access memory is changed by biasing, to perform write and erase operations.

The embodiments of the present disclosure discussed above have advantages over existing apparatus and processes, and the advantages are summarized below. The present disclosure introduces the transistor as the control unit of the resistive random access memory, to avoid overshoot current during switching resistance. Besides, the resistive random access memory shows stable data retention characteristics in multilevel operation, and the memory states of the resistive random access memory are obvious to show excellent memory characteristics.

Further, the active layer of the transistor and the resistive switching layer of the resistive random access memory are formed of AZTO, which has advantages of novel transparent characteristics, high carrier mobility, superior low-temperature deposition conditions, and uniform amorphous area. Therefore, the transistor and the resistive random access memory could be manufactured in low temperature circumstance and suitable in flexible electronics field. More importantly, using the same material to manufacture active layer and the resistive switching layer achieves purposes of system integration and cost reduction.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory structure, comprising:
    a control unit, comprising:
        a source and a drain;
        an active layer in contact with a portion of the source and a portion of the drain;
        a gate layer; and
        a gate insulation layer disposed between the active layer and the gate layer; and
    a memory unit electrically connected to the control unit, the memory unit comprising:
        a bottom electrode layer;
        a top electrode layer; and
        a resistive switching layer interposed between the bottom electrode layer and the top electrode layer, wherein the resistive switching layer and the active layer are formed of aluminum zinc tin oxide (AZTO).

2. The memory structure of claim 1, wherein the gate layer is formed of silicon, and the gate insulation layer is formed of silicon dioxide.

3. The memory structure of claim 1, wherein the source and the drain are formed of titanium.

4. The memory structure of claim 1, wherein the top electrode layer is formed of titanium, titanium nitride, indium tin oxide (ITO) or combinations thereof, and the bottom electrode layer is formed of gold, platinum or combinations thereof.

5. The memory structure of claim 1, further comprising a hafnium oxide interposed between the resistive switching layer and the bottom electrode layer.

6. The memory structure of claim 1, wherein the memory unit is in contact with the source or the drain.

* * * * *